(12) United States Patent
Lee et al.

(10) Patent No.: US 7,826,306 B2
(45) Date of Patent: Nov. 2, 2010

(54) SEMICONDUCTOR MEMORY APPARATUS

(75) Inventors: Ji-Wang Lee, Ichon (KR); Yong-Ju Kim, Ichon (KR); Sung-Woo Han, Ichon (KR); Hee-Woong Song, Ichon (KR); Ic-Su Oh, Ichon (KR); Hyung-Soo Kim, Ichon (KR); Tae-Jin Hwang, Ichon (KR); Hae-Rang Choi, Ichon (KR); Jae-Min Jang, Ichon (KR); Chang-Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 154 days.

(21) Appl. No.: 12/332,298

(22) Filed: Dec. 10, 2008

(65) Prior Publication Data

US 2010/0054047 A1    Mar. 4, 2010

(30) Foreign Application Priority Data

Sep. 3, 2008    (KR)    ................... 10-2008-0086751

(51) Int. Cl.
*G11C 8/00*    (2006.01)
(52) U.S. Cl. ................... 365/233.1; 365/63; 365/198
(58) Field of Classification Search ................... 365/198
See application file for complete search history.

(56) References Cited

U.S. PATENT DOCUMENTS

| 5,717,647 | A | * | 2/1998 | Hush et al. | ............. | 365/230.05 |
| 5,717,651 | A | * | 2/1998 | Kikukawa et al. | ........ | 365/233.1 |
| 5,923,195 | A |   | 7/1999 | Graf, III |   |   |
| 6,252,448 | B1 |   | 6/2001 | Schober |   |   |

FOREIGN PATENT DOCUMENTS

| KR | 10-1997-0077272 | 12/1997 |
| KR | 1020010045596 A | 6/2001 |
| KR | 1020020018142 A | 3/2002 |
| KR | 1020050068323 A | 7/2005 |
| KR | 1020050100262 A | 10/2005 |

* cited by examiner

*Primary Examiner*—Tan T. Nguyen
(74) *Attorney, Agent, or Firm*—Baker & McKenzie LLP

(57) ABSTRACT

A semiconductor memory apparatus includes a clock generator configured to generate an internal clock signal, an asynchronous data input buffer configured to buffer a data input signal through a data pad to output a buffered data signal, and a synchronous data input buffer configured to buffer the buffered data signal synchronously with the internal clock signal, wherein a length of a line, through which the internal clock signal is transmitted to the synchronous data input buffer, is configured to be substantially the same with a length of a line, through which the buffered data is transmitted to the synchronous data input buffer.

17 Claims, 2 Drawing Sheets

SEMICONDUCTOR MEMORY APPARATUS

CROSS-REFERENCES TO RELATED APPLICATION

The present application claims the benefit under 35 U.S.C 119(a) to Korean Application No. 10-2008-0086751, filed on Sep. 3, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to a data input circuit of a semiconductor memory apparatus.

2. Related Art

In general, in order to perform a data input operation, a semiconductor memory apparatus commonly includes a plurality of data pads and a plurality of data input buffers connected to respective ones of the plurality of data pads. Accordingly, respective ones of the plurality of data input buffers perform a buffering operation on data synchronously with an internal clock transmitted from a Delay Locked Loop (DLL) circuit or a Phase Locked Loop (PLL) circuit. In order that respective data input buffers operate normally, a timing between the internal clock signals and respective input data signals, which is transmitted to respective data input buffers, should coincide. However, as a semiconductor memory apparatus has been improved with high speed operation, a timing margin between the internal clock signals and the input data signals that is transmitted to respective data input buffers has decreased. Moreover, since timing differences between internal clock signals transmitted to respective data input buffers during high speed operations require detailed attention compared to low speed operations, operational stability in a corresponding data input circuit has become degraded.

To solve this problem, a semiconductor memory apparatus uses a structure in which respective data input buffers are densely arranged adjacent each other. In addition, in order to solve the problem of increased differences in lengths between respective data pads and respective data input buffers, structures are provided in which lengths of respective data input lines are the same with each other.

FIG. 1 is a schematic diagram of a conventional semiconductor memory apparatus. In FIG. 1, a data input circuit 5 of a semiconductor memory apparatus is shown, wherein buffering operations on data input through only five data pads are illustrated for the convenience of description.

In FIG. 1, the data input circuit 5 includes five data pads 1-1 to 1-5, so that respective data pads 1-1 to 1-5 are connected to five data input buffers 3-1 to 3-5 through respective data lines 2-1 to 2-5. The five data input buffers 3-1 to 3-5 respectively buffer input data signals 'din1' to 'din5' that are input through respective data lines 2-1 to 2-5, to output buffered data signals 'dbuf1' to 'dbuf5' to an interior of a semiconductor memory apparatus. For this buffering operation, each of the five data input buffers 3-1 to 3-5 receive an internal clock signal 'clk_int'.

The five data input buffers 3-1 to 3-5 are arranged to neighbor each other. Accordingly, although the internal clock signal 'clk_int' is employed as a clock signal having a high frequency, a timing difference of the internal clock signal 'clk_int' transmitted to each of the five data input buffers 3-1 to 3-5 is not very large. In addition, all of the five data lines 2-1 to 2-5 located between the five data pads 1-1 to 1-5 and the five data input buffers 3-1 to 3-5 have the same lengths. As shown in FIG. 1, the five data lines 2-1 to 2-5 are arranged to have different configuration pathways, such as data lines 2-2 and 2-3.

Since the five data input buffers 3-1 to 3-5 should be arranged to neighbor each other, they may occupy areas that obstruct a realization of a highly integrated semiconductor memory apparatus. In addition, coupling noises may occur in input data signals 'din<1:5>' due to the data lines 2-1 to 2-5 having the different configuration pathways, thereby degrading stability of a data input operation. As a result, a data input circuit of a semiconductor memory apparatus is problematic in occupational area and operational stability, thereby preventing the realization of high speed operation and high integration.

SUMMARY

A semiconductor memory apparatus capable of securing stability and improving area efficiency in a data input operation is described herein.

In one aspect, a semiconductor memory apparatus includes a synchronous data input buffer configured to buffer a buffered data signal synchronously with an internal clock signal, wherein a length of a line, through which the internal clock signal is transmitted to the synchronous data input buffer, is configured to be substantially the same with a length of a line, through which the buffered data is transmitted to the synchronous data input buffer.

In another aspect, a semiconductor memory apparatus includes a clock generator configured to generate an internal clock signal; a first asynchronous data input buffer configured to buffer a data signal input through a first data pad to output a first buffered data signal; a first synchronous data input buffer configured to buffer the first buffered data signal synchronously with the internal clock signal; a second asynchronous data input buffer configured to buffer a data signal input through a second data pad to output a second buffered data signal; and a second synchronous data input buffer configured to buffer the second buffered data signal synchronously with the internal clock signal, wherein a length of a line, through which the internal clock signal is transmitted to the first synchronous data input buffer, is configured to be substantially the same with a length of a line, through which the first buffered data signal is transmitted to the first synchronous data input buffer, and a length of a line, through which the internal clock signal is transmitted to the second synchronous data input buffer, is configured to be substantially the same with a length of a line, through which the second buffered data signal is transmitted to the second synchronous data input buffer.

In another aspect, a semiconductor memory apparatus includes a first data input buffer configured to asynchronously buffer a data signal and to output the buffered data signal; and a second data input buffer configured to buffer the buffered data signal synchronously with an internal clock signal, wherein a length of a first transmission line transmitting the internal clock signal to the second data input buffer is substantially the same as a length of a second transmission line transmitting the buffered data signal to the second data input buffer.

In another aspect, a semiconductor memory apparatus includes a clock generator configured to generate an internal clock signal; a first plurality of buffers, each configured to receive input data signals and to output buffered data signals; a second plurality of buffers, each configured to receive the buffered data signals and the internal clock signal to buffer the buffered input data signals using the internal clock signal; a first plurality of transmission lines, each configured to transmit the internal clock signal to each of the second plurality of buffers; a second plurality of transmission lines, each configured to transmit the buffered data signals to corresponding ones of the second plurality of buffers, wherein lengths of the first plurality of transmission lines are substantially the same as lengths of the second plurality of transmission lines.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
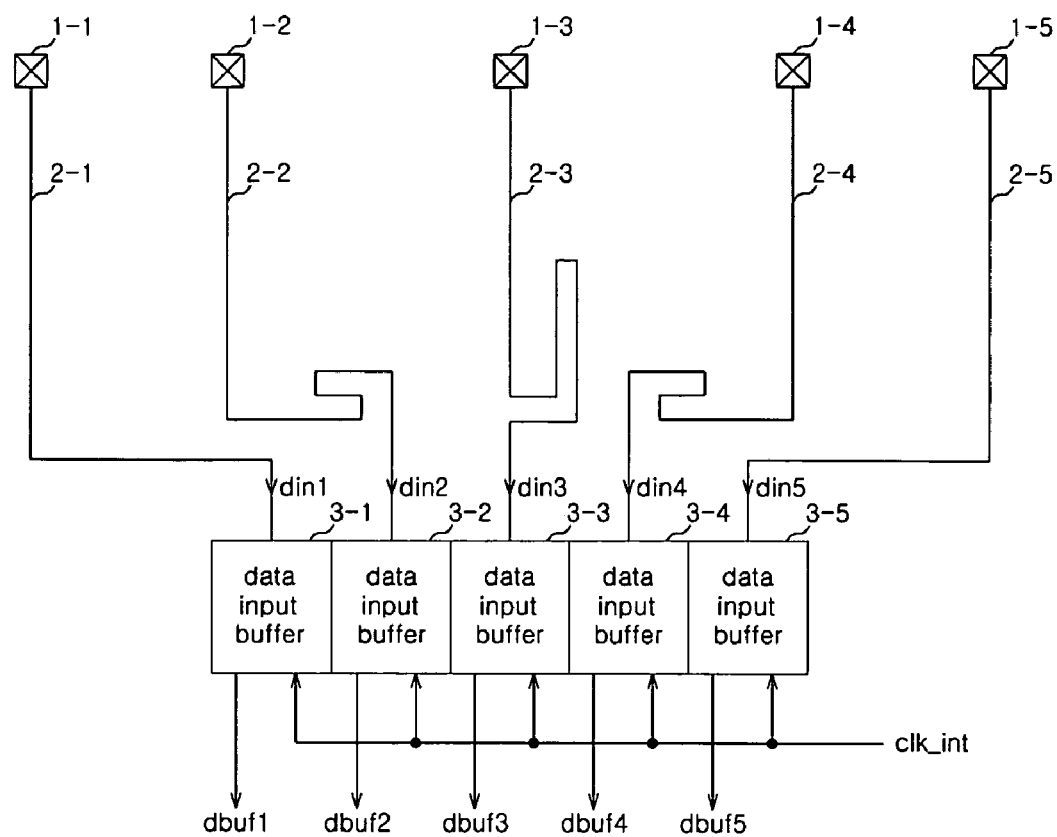
FIG. 1 is a schematic diagram of a conventional semiconductor memory apparatus.
Figure 2:
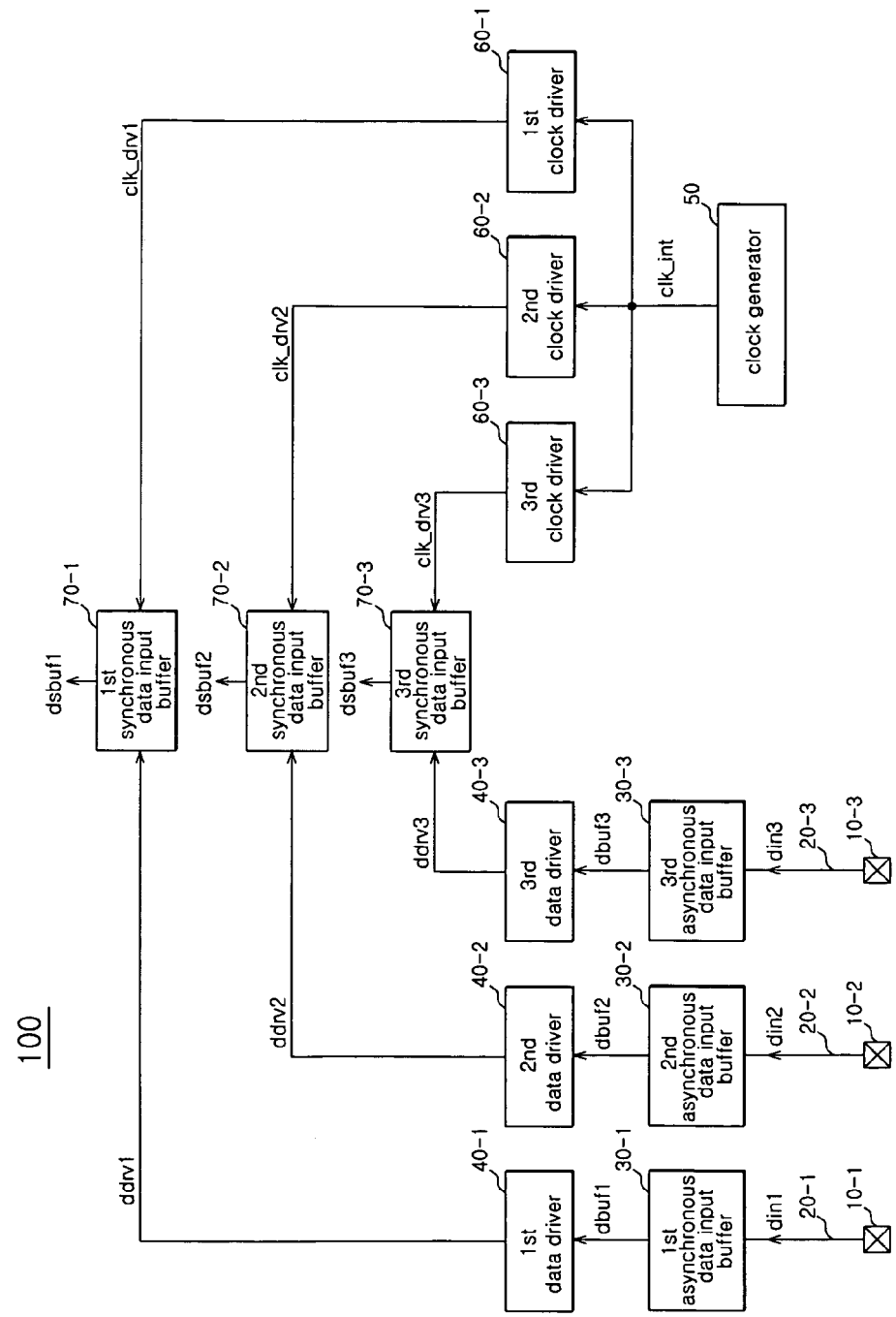
FIG. 2 is a schematic diagram of an exemplary semiconductor memory apparatus according to one embodiment.

FIG. 2 is a schematic diagram of an exemplary semiconductor memory apparatus 100 according to one embodiment. In FIG. 2, for the sake of brevity a structure for performing buffering operations on data input through only 3 data pads is shown. Accordingly, more or less than 3 data pads can be provided according to the exemplary semiconductor memory apparatus.

In FIG. 2, the semiconductor memory apparatus 100 can be configured to include first to third data pads 10-1 to 10-3, first to third data lines 20-1 to 20-3, first to third asynchronous data input buffers 30-1 to 30-3, first to third data drivers 40-1 to 40-3, a clock generator 50, first to third clock drivers 60-1 to 60-3, and first to third synchronous data input buffers 70-1 to 70-3. Although not specifically shown, the semiconductor memory apparatus 100 can be integrated on a substrate. For example, one a printed circuit board/substrate, or integrated in and/or on a semiconductor substrate.

The first to third data lines 20-1 to 20-3 can be connected to the first to third data pads 10-1 to 10-3, respectively. The first to third asynchronous data input buffers 30-1 to 30-3 can buffer input data signals 'din1' to 'din3', respectively, that can be transmitted through the first to third data lines 20-1 to 20-3 to generate first to third buffered data signals 'dbuf1' to 'dbuf3', respectively. The first to third data drivers 40-1 to 40-3 can drive the first to third buffered data signals 'dbuf1' to 'dbuf3' to generate first to third driving data signals 'ddrv1' to 'ddrv3', respectively.

The clock generator 50 can generate an internal clock signal 'clk_int'. For example, the first to third clock drivers 60-1 to 60-3 can drive the internal clock signal 'clk_int' to generate first to third driving clock signals 'clk_drv1' to 'clk_drv3', respectively. In addition, the first to third synchronous data input buffers 70-1 to 70-3 can buffer predetermined one of the first to third driving data signals 'ddrv1' to 'ddrv3' synchronously with one of the first to third driving clocks signals 'clk_drv1' to 'clk_drv3', to generate first to third synchronous buffered data signals 'dsbuf1' to 'dsbuf3', respectively.

Alternatively, in FIG. 2, the first to third data drivers 40-1 to 40-3 and the first to third clock drivers 60-1 to 60-3 may not be necessary. However, by providing the first to third data drivers 40-1 to 40-3 and the first to third clock drivers 60-1 to 60-3, signal characteristics of respective data and clock signals can be improved. Here, sizes of the first data driver 40-1 and the first clock driver 60-1, the second data driver 40-2 and the second clock driver 60-2, and the third data driver 40-3 and the third clock driver 60-3 should be adjusted such that respective data drivers 40-1 to 40-3 have the same driving abilities with corresponding ones of the clock drivers 60-1 to 60-3.

In FIG. 2, the clock generator 50 can be employed by using a DLL circuit or a PLL circuit. Accordingly, the data input buffers 30-1 to 30-3 can be classified into asynchronous data input buffers and synchronous data input buffers. The first to third asynchronous data input buffers 30-1 to 30-3 can perform buffering operations on the first to third input data signals 'din1' to 'din3', regardless of a clock signal input. Alternatively, the first to third synchronous data input buffers 70-1 to 70-3 can perform buffering operations on the first to third driving data signals 'ddrv1' to 'ddrv3', by using the first to third driving clock signals 'clk_drv1' to 'clk_drv3', respectively, which can be generated by driving the internal clock signal 'clk_int'.

In FIG. 2, a length of a signal line, through which the first buffered data signal 'dbuf1' output from the first asynchronous data input buffer 30-1 is transmitted to the first synchronous data input buffer 70-1 via the first data driver 40-1 as the first driving data signal 'ddrv1', can be substantially the same with that of a signal line, through which the internal clock signal 'clk_int' output from the clock generator 50 is transmitted to the first synchronous data input buffer 70-1 via the first clock driver 60-1 as the first driving clock signal 'clk_drv1'. Accordingly, lengths of respective signal lines, through which the second buffered data signal 'dbuf2' and the third buffered data signal 'dbuf3' can be transmitted to the second synchronous data input buffer 70-2 and the third synchronous data input buffer 70-3, respectively, can be substantially the same with those of signal lines, through which the internal clock signal 'clk_int' can be transmitted to the second synchronous data input buffer 70-2 and the third synchronous data input buffer 70-3.

Thus, the first synchronous data input buffer 70-1 can receive as inputs the first driving clock signal 'clk_drv1' and the first driving data signal 'ddrv1' at substantially the same timing. Similarly, the second synchronous data input buffer 70-2 can also receive as inputs the second driving clock signal 'clk_drv2' and the second driving data signal 'ddrv2' at substantially the same timing. Likewise, the third synchronous data input buffer 70-3 can also receive as inputs the third driving clock signal 'clk_drv3' and the third driving data signal 'ddrv3' at substantially the same timing. Accordingly, timing margins between data and clock signals, which can be input to the first to third synchronous data input buffers 70-1 to 70-3, respectively, can increase, thereby performing buffering operations on input data more stably.

Of course, generation timings of the first to third synchronous buffered data signals 'dsbuf1' to 'dsbuf'3 can be different from each other. In order to improve stability of a data input operation of a semiconductor memory apparatus, it is important whether the first to third synchronous buffered data signals 'dsbuf1' to 'dsbuf3' are stably generated, whereas the generation timings may not be as important.

In FIG. 2, the first to third asynchronous data input buffers 30-1 to 30-3 are not necessarily required to be arranged adjacent to each other, and the first to third synchronous data input buffers 70-1 to 70-3 are not necessarily required to be arranged adjacent to each other. Accordingly, since an internal area of the semiconductor memory apparatus is very valuable, the first to third asynchronous data input buffers 30-1 to 30-3 and the first to third synchronous data input buffers 70-1 to 70-3 can be arranged to improve area efficiency of the semiconductor memory apparatus.

A semiconductor memory apparatus can include data input buffers classified into one of asynchronous data input buffers and synchronous data input buffers. In addition, lengths of signal lines between synchronous data input buffers and asynchronous data input buffers can be substantially the same with those of signal lines between synchronous data input buffers and a clock signal generator. Thus, since timing margins between data and clock signals, which can be input to synchronous data input buffers, are improved, stabilities of buffering operations on input data can also be improved. In addition, due to an arrangement of data input buffers in a semiconductor memory apparatus, area efficiency of an internal area of a semiconductor memory apparatus can be improved. As a result, a semiconductor memory apparatus can makes it easier to realize high speed operation and high integration of a semiconductor memory apparatus.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A semiconductor memory apparatus, comprising:
    a synchronous data input buffer configured to buffer a buffered data signal synchronously with an internal clock signal,
    wherein a length of a line, through which the internal clock signal is transmitted to the synchronous data input buffer, is configured to be substantially the same with a length of a line, through which the buffered data is transmitted to the synchronous data input buffer.

2. The semiconductor memory apparatus of claim 1, further comprising:
    an asynchronous data input buffer configured to buffer a data signal input through a data pad to output the buffered data signal.

3. The semiconductor memory apparatus of claim 2, wherein the clock driver and the data driver are configured to have substantially the same driving abilities to each other.

4. The semiconductor memory apparatus of claim 1, wherein the semiconductor memory apparatus further includes:
    a clock generator configured to generate the internal clock signal;
    a clock driver configured to drive the internal clock signal output from the clock generator to transmit the driven internal clock signal to the synchronous data input buffer; and
    a data driver configured to drive the buffered data signal output from the asynchronous data input buffer to transmit the driven buffered data signal to the synchronous data input buffer.

5. A semiconductor memory apparatus, comprising:
    a clock generator configured to generate an internal clock signal;
    a first asynchronous data input buffer configured to buffer a data signal input through a first data pad to output a first buffered data signal;
    a first synchronous data input buffer configured to buffer the first buffered data signal synchronously with the internal clock signal;
    a second asynchronous data input buffer configured to buffer a data signal input through a second data pad to output a second buffered data signal; and
    a second synchronous data input buffer configured to buffer the second buffered data signal synchronously with the internal clock signal,
    wherein a length of a line, through which the internal clock signal is transmitted to the first synchronous data input buffer, is configured to be substantially the same with a length of a line, through which the first buffered data signal is transmitted to the first synchronous data input buffer, and a length of a line, through which the internal clock signal is transmitted to the second synchronous data input buffer, is configured to be substantially the same with a length of a line, through which the second buffered data signal is transmitted to the second synchronous data input buffer.

6. The semiconductor memory apparatus of claim 5, wherein the semiconductor memory apparatus further includes:
    a first clock driver configured to drive the internal clock signal output from the clock generator to transmit the driven internal clock signal to the first synchronous data input buffer;
    a first data driver configured to drive the first buffered data signal output from the first asynchronous data input buffer to transmit the driven first buffered data signal to the first synchronous data input buffer;
    a second clock driver configured to drive the internal clock signal output from the clock generator to transmit the driven internal clock signal to the second synchronous data input buffer; and
    a second data driver configured to drive the second buffered data signal output from the second asynchronous data input buffer to transmit the driven second buffered data signal to the second synchronous data input buffer.

7. The semiconductor memory apparatus of claim 6, wherein the first clock driver and the first data driver are configured to have substantially the same driving abilities to each other, and the second clock driver and the second data driver are configured to have substantially the same driving abilities to each other.

8. A semiconductor memory apparatus, comprising:
    a first data input buffer configured to asynchronously buffer a data signal and to output the buffered data signal; and
    a second data input buffer configured to buffer the buffered data signal synchronously with an internal clock signal,
    wherein a length of a first transmission line transmitting the internal clock signal to the second data input buffer is substantially the same as a length of a second transmission line transmitting the buffered data signal to the second data input buffer.

9. The semiconductor memory apparatus of claim 8, further comprising a plurality of drivers to drive and transmit the internal clock signal to the second data input buffer and to drive and transmit the buffered data signal to the second data input buffer.

10. The semiconductor memory apparatus of claim 9, wherein each of the plurality of drivers are substantially the same.

11. A semiconductor memory apparatus, comprising:
    a clock generator configured to generate an internal clock signal;
    a first plurality of buffers, each configured to receive input data signals and to output buffered data signals;
    a second plurality of buffers, each configured to receive the buffered data signals and the internal clock signal to buffer the buffered input data signals using the internal clock signal;

a first plurality of transmission lines, each configured to transmit the internal clock signal to each of the second plurality of buffers;

a second plurality of transmission lines, each configured to transmit the buffered data signals to corresponding ones of the second plurality of buffers, wherein lengths of the first plurality of transmission lines are substantially the same as lengths of the second plurality of transmission lines.

12. The semiconductor memory apparatus of claim 11, further comprising a plurality of drivers, each driving and transmitting one of the internal clock signal and the buffered data signals to the second plurality of buffers.

13. The semiconductor memory apparatus of claim 11, wherein each of the first plurality of buffers asynchronously buffer the input data signals.

14. The semiconductor memory apparatus of claim 11, wherein each of the second plurality of buffers synchronously buffer the buffered input data signals and the internal clock signal.

15. The semiconductor memory apparatus of claim 11, further comprising a plurality of drivers, each driving and transmitting one of the internal clock signal and the buffered data input signals to the second plurality of buffers.

16. The semiconductor memory apparatus of claim 15, wherein each of the first plurality of buffers, the second plurality of buffers, and the plurality of drivers are integrated on a substrate.

17. The semiconductor memory apparatus of claim 11, wherein the clock generator includes one of a Delayed Locked Loop circuit and a Phase Locked Loop circuit.

* * * * *